US005712884A

United States Patent [19]

Jeong

[11] Patent Number: 5,712,884

[45] Date of Patent: Jan. 27, 1998

[54] DATA RECEIVING METHOD AND CIRCUIT OF DIGITAL COMMUNICATION SYSTEM

[75] Inventor: Deog-Kyoon Jeong, Seoul, Rep. of Korea

[73] Assignee: Samsung Electronics Co., Ltd., Suwon, Rep. of Korea

[21] Appl. No.: 415,056

[22] Filed: Mar. 31, 1995

[51] Int. Cl.$^6$ .................................. H03D 3/24; H04L 7/00

[52] U.S. Cl. ........................... 375/375; 375/371; 375/373; 375/376; 327/149; 327/158; 327/161

[58] Field of Search ..................................... 375/376, 375, 375/373, 371, 354, 355, 316; 371/1; 237/2, 3, 141, 144, 146, 147, 149, 150, 153, 155, 156, 158, 159, 161, 162, 163

[56] References Cited

U.S. PATENT DOCUMENTS 5,161,173 11/1992 Nordby .................................. 375/376
5,488,641 1/1996 Ozkan .................................... 375/376

OTHER PUBLICATIONS

500 Mbyte/sec Data-Rate 512 Kbitsx 9 DRAM Using a Novel I/O Interface, N.Kushiyama et al. 1992 Symposium on VLSI Circuits digest of Technical Papers, pp. 66 -67.

Design of PLL-Based Clock Generation Circuits, Deog-Kyoon Jeong et al, IEEE Journal of solid-state circuits, vol. 22, No. 2, Apr. 1987, pp. 255 -261.

*Primary Examiner*—Stephen Chin
*Assistant Examiner*—Hai H. Phan
*Attorney, Agent, or Firm*—Cushman Darby & Cushman Intellectual Property Group of Pillsbury Madison & Sutro LLP

[57] ABSTRACT

A data receiving circuit of a digital communication system which receives a transmitted input data bit column and input clock, comprising a first clock generator having a first delay that receives the input clock and outputs a first clock, a delay locked loop having secondary delay cells connected in series to each other which allow the first clock to be sequentially phase-delayed by 2π/2n and as a result, output secondary clocks, and which locks a phase difference between the first clock and an output of delay cell of 2π radian, a phase detector for outputting a phase control signal which controls the delay time of the first delay cell so that the clocks outputted from the first clock generator and the delay locked loop can have rising edges in the middle point of a corresponding input data bit by detecting the phase difference between phases of the input data bit column and the clocks and then controlling the first delay cell, and a data register controlled by the clocks to receive the input data bit column.

8 Claims, 6 Drawing Sheets

DATA RECEIVING METHOD AND CIRCUIT OF DIGITAL COMMUNICATION SYSTEM

FIELD OF THE INVENTION

The present invention relates to a data receiving circuit for digital communication systems, and more particularly to a digital data receiving method and circuit capable of improving the quality of data reception by spontaneously correcting a timing skew between data and clocks transmitted from the transmission side.

BACKGROUND OF THE INVENTION

Generally, in widely used digital communication systems, a transmitting stage serves to transmit data and clocks, while a receiving stage serves to synchronize the clocks with the data and then sample the data. In such digital communication systems, for instance, a digital communication system having a processor as the transmitting stage and a memory device as the receiving stage, a synchronizing clock and a data bit column are transmitted from the processor to the memory device via respective data buses. On the transmission side, the data bit column and phase of the synchronizing clock are outputted to be consistent with each other, while on the memory device side, the data bit column received and the phase of the synchronizing clock may be inconsistent with each other, so that timing skew may occur. The reason why timing skew is generated is that data bus path length and a capacitance on a bus path for transmitting the data bit column are not completely consistent with those for transmitting the synchronizing clock. The higher the data transmission rate executed, the more serious the problems resulting from the timing skew are. Further, it is known that reception of the transmitted data, i.e. data sampling may be not possible due to such problems.

Hence, it is necessarily essential to eliminate timing skew between the data bit column and the synchronizing clock so as to achieve high-speed data transmission. One prior art solution for such a problem is disclosed in pages 66 through 67 of "1992 SYMPOSIUM ON VLSI CIRCUITS DIGEST OF TECHNICAL PAPERS". In this method for reducing occurrence of the timing skew, the clock and data are transmitted to the receiving stage via a transmission path having the same distance on the bus, so that the transmission times for the clock and data are identical to each other.

In the conventional method mentioned above, however, timing skew appearing in the receiving stage is not completely eliminated in that rigid limits must be followed in designing the interface so as to have the same moving distance between the clock and data, and in that the loads applied to each of the two paths in the course of transmitting the clock and data are not identical to each other, even though the transmitting paths for the clock and data have an identical length.

In current digital systems which pursue high-speed data transmission, it is apparent that the method for eliminating timing skew by adjusting a circuit construction such that transmission traces of the clock and data are consistent with each other, has an obvious limitation in eliminating timing skew.

SUMMARY OF THE INVENTION

It is therefore one object of the present invention to provide a data receiving method and circuit of a digital communication system capable of spontaneously eliminating timing skew occurring between an input clock and input data, to solve the problems depicted above.

It is another object of the present invention to provide a data receiving method and circuit of a digital communication system capable of receiving data applied at high speed by using a low frequency clock.

To achieve these objects, the present invention is directed to a data receiving method and circuit in which the input clock is received through a controllable delay cell of the delay time, and 2n clocks (wherein n represents a natural number) having a phase delay of $2\pi/2n$ in order and each having an identical frequency with the input clock are generated. Thereafter, the 2n clocks are phase-compared with the input data bits corresponding to respective clocks, thereby controlling a phase delay time of the delay cell receiving the input clock. Here, as the 2n clocks are locked to the middle point of a logic interval of the input data bits corresponding to respective clocks so as to have a rising edge or falling edge, the 2n clocks are supplied to the synchronizing clock used during the sampling of the input data in the data register. In this case, even though timing skew between the synchronizing clock and data bit column may occur during the data transmission, the data receiving method and circuit according to the present invention is capable of spontaneously correcting the timing skew, so that accurate data reception can be achieved.

Further, to achieve these objects, the present invention is directed to a data receiving method and circuit in which the input clock inputted to a data receiving portion transmits a terminal frequency, and disregards the phase thereof, and as the phase of internal clocks having the frequency of the input clock is synchronous to the input data, even if timing skew between the input clock and data may occur, accurate data sampling can be achieved regardless of the occurrence of timing skew.

BRIEF DESCRIPTION OF DRAWING

These and other objects, features, and advantages of the present invention are better understood by reading the following detailed description of the invention, taken in conjunction with the accompanying drawings. In the drawings, it should be noted that like elements represent like symbols or reference numerals, wherein.

DETAILED DESCRIPTION OF THE PREFERRED EMBODIMENTS

In the following description, details of circuits of each portion and elements numbers and so on, are set forth in order to provide a thorough understanding of the present invention. It will, however, be obvious to those skilled in the art that the present invention may be practiced without these specific details, or with alternative specific details. Hereinafter, for the convenience of explanation, assuming that a maximum transmission speed of an input data bit column is 10 times as high as that of the input clock, details of explanation for data receiving method and circuit will be discussed.

Figure 1:
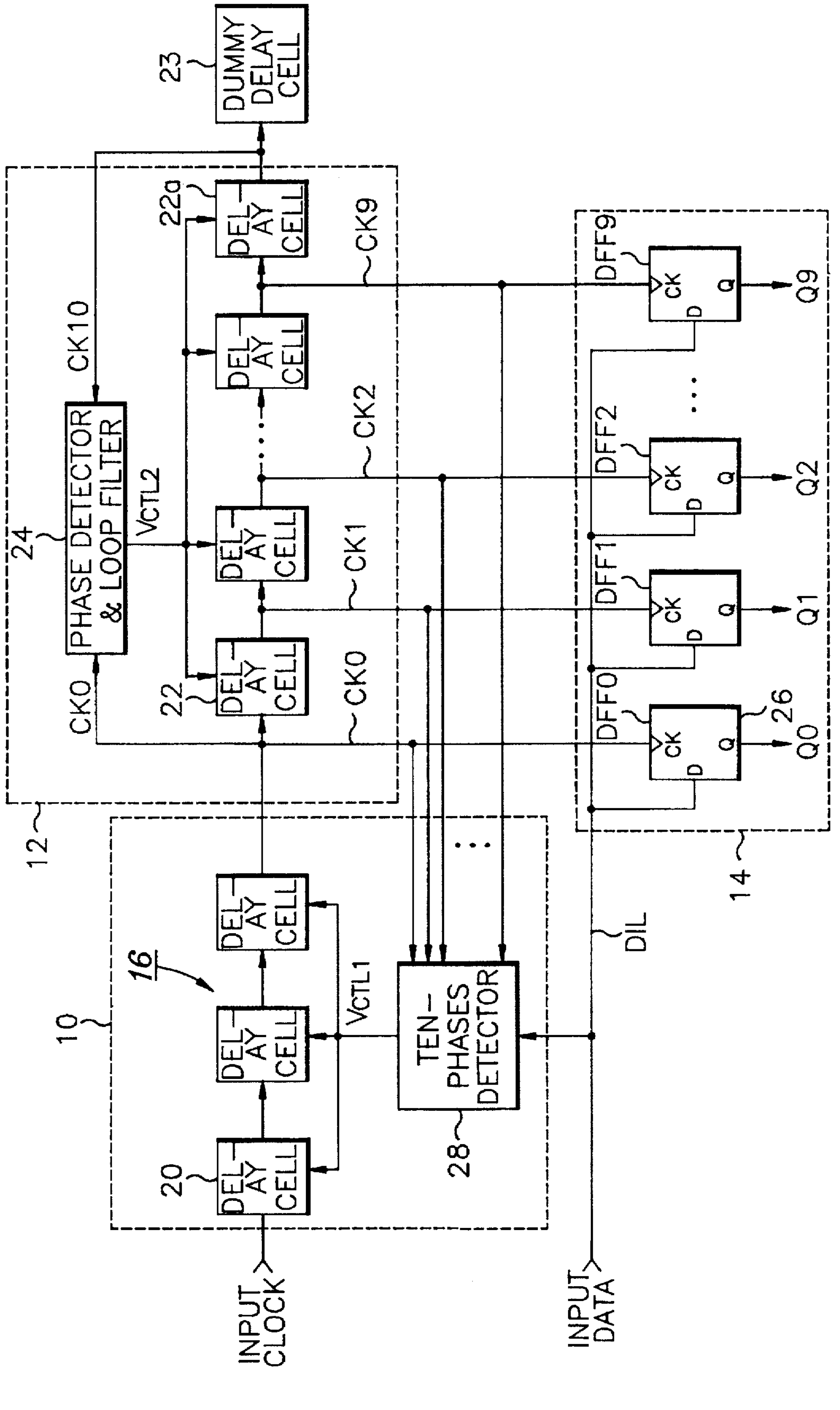
FIG. 1 is a block diagram showing a construction of a data receiving portion according to the present invention.

FIG. 1 is a block diagram showing a construction of a data receiving portion according to the present invention, in which a data receiving circuit generates a clock for performing a data sampling through a double delay locked loop DLL (hereinafter, referred to as DLL) structure Comprised of a first delay locked loop DLL 10 and a secondary delay locked loop DLL 12. Here, the input clock transmitted from the transmission stage inputs to the first DLL 10, and a clock CK0 as the output of the first DLL 10 is transmitted to the secondary DLL 12.

The secondary DLL 12 is serially connected so that the output at the front stage thereof can be supplied to the input at the rear stage thereof, including 9 delay cells 22 for producing clocks CK1–CK9 one by one at respective output stages and a dummy delay cell 23 for receiving the output clock CK10 of a final delay cell 22*a* at the last rear stage, in which each delay cell outputs a clock which delays an inputted clock by $2\pi/10$ radian (that is, 36°).

A first and eleventh clocks CK0 and CK10 among the clocks CK0–CK10 are respectively supplied to two inputs of a phase detector and loop filter 24 for detecting a phase difference between the two clocks and thereby outputting a phase control signal $V_{CTL2}$. The phase detector and loop filter 24 outputs the phase control signal $V_{CTL2}$ for rendering the delay time of each delay cell 22 and 22*a* to be increased, when the phase difference between two clocks CK0 and CK10 is within $2\pi$. On the other hand, the phase detector and loop filter 24 outputs the phase control signal $V_{CTL2}$ for shortening the delay time of each delay cell 22 and 22*a*, when the phase difference between two clocks CK0 and CK10 is over $2\pi$, so that two clocks CK0 and CK10 are locked to have the phase difference of $2\pi$. Since each delay cell 22 and 22*a* has the identical delay time, the clocks CK1–CK10 outputted from the secondary DLL 12 represents the clocks which delay the clock CK0 outputted from the first DLL 10 by 36° in order. The dummy cell 23 which receives the clock CK10 serves to accurately maintain the phase difference of each clock, by providing a consistent load on a node for outputting the clock CK10 with that on adjacent nodes thereto. The clocks CK0 to CK9 are respectively supplied to a data register 14 constituted as a master-slave type of 10 flip-flops DFF0–DFF9 26, and a ten-phases detector 28 of the first DLL 10.

The first DLL 10 is comprised of the ten-phases detector 28 for receiving the clocks CK0–CK9 and an input data bit column, and a first clock generator 16, having three delay cells 20 being serially connected to each other whose one terminal receives an input clock transmitted from the exterior and whose other terminal outputs the clock CK0 which has the frequency of the input clock. The ten-phases detector 28 outputs a phase control signal $V_{CTL1}$ for controlling the delay time of the delay cells 20 by using the clocks CK0–CK9 received from the secondary DLL 12 and the input data, and serves to lock the clock CK0 outputted from the first DLL 10 to the middle point of a logic interval (hereinafter, referred to as the middle point of data bit) having a corresponding single input data bit so as to have a rising edge or a falling edge. Hence, the output clocks CK1–CK10 of the secondary DLL 12, which phase-delays the clock CK0 sequentially, is phase-delayed in the same manner as the clock CK0. As a result, the clocks CK0–CK9 are controlled to have rising edges in the middle point of a data bit corresponding to each clock. It is preferable that the number of the delay cells 20 constituting the first DLL 10 is comprised so that the control width of the phase delay becomes at least over one period of the input clock. In an embodiment of the present invention, the first DLL 10 is made up of three delay cells.

Figure 2:
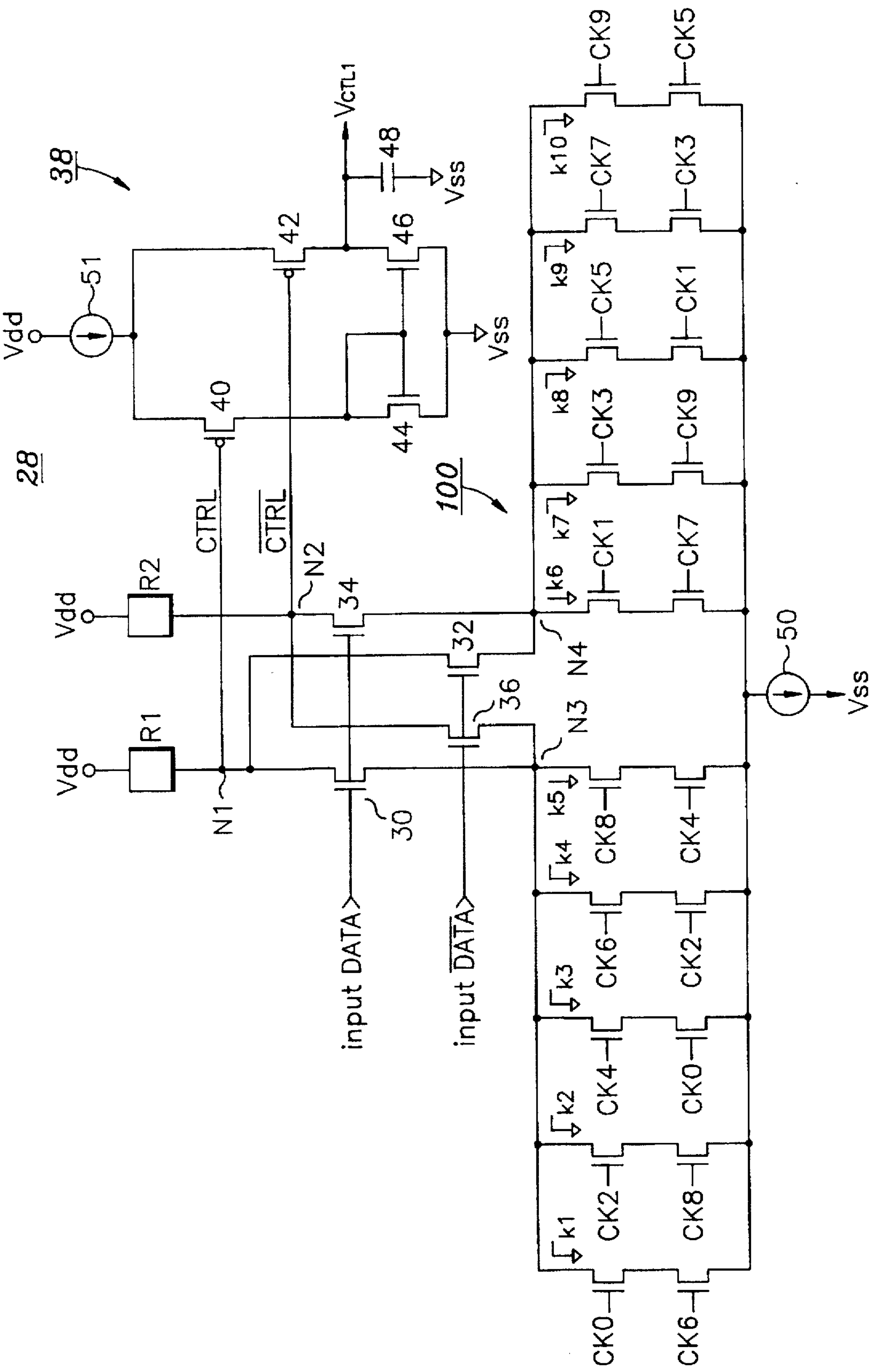
FIG. 2 is a circuit diagram showing a ten-phases detector of FIG. 1.

FIG. 2 is a circuit diagram showing a ten-phases detector of FIG. 1, in which an output node N1 for outputting a detecting signal CTRL is connected to an operating voltage Vdd via a load R1, and an output node N2 for outputting an inverted detecting signal $\overline{\text{CTRL}}$ is connected to an operating voltage Vdd via a load R2. The output node N1 is connected to a first discharging node N3 via an n-channel transistor 30 and to a second discharging node N4 via an n-channel transistor 32. The output node N2 is connected to the second discharging node N4 via an n-channel transistor 34 and to the first discharging node N3 via an n-channel transistor 36. An inverted input data bit column $\overline{\text{DATA}}$ transmitted is applied to the gates of the n-channel transistors 32 and 36, while an input data bit column DATA is applied to the gates of the n-channel transistors 30 and 34.

Each of the first and second discharge nodes N3 and N4 is connected to a discharge controller 100 composed of a first through tenth discharge lines k1 to k10 so that the first and second discharge nodes alternatively form a discharging path each other in response to the logic levels of the clocks CK0–CK9. The first discharging node N3 is connected in common to each of one terminals of the first to the fifth discharging lines k1 to k5 being connected in parallel with each other, and the second discharging node N4 is connected in common to each of one terminals of the sixth to tenth discharging lines k6 to k10 being connected in parallel with each other. Each of the other terminals of the first and tenth discharging lines k1 to k10 is connected to a grounding terminal via a current source 50. Respective discharging lines are made up of two n-channel transistors whose channels are connected in series with each other. Any one of the clocks CK0–CK9 outputted from the afore-mentioned secondary DLL 12 inputs to the gates of respective transistors. The respective n-channel transistors become turned on, when a logic level of "1" (that is, a logic high level), is applied to the gates thereof, while the respective n-channel transistors become turned off, when a logic level of "0" (that is, a logic low level) is applied to the gates thereof. Clocks applied to the transistors of respective discharging lines, the logic levels of the clocks in accordance with the occurrence order of the clocks, and the discharging lines forming a discharging path by connecting the current source 50 are indicated by the following Table <1>.

TABLE 1

| CLOCK LOGIC LEVEL | | | | | | | | | | DISCHARGING LINE FORMING PATH | |
|---|---|---|---|---|---|---|---|---|---|---|---|
| | | | | | | | | | | DISCHARGING | INPUT |
| CK0 | CK1 | CK2 | CK3 | CK4 | CK5 | CK6 | CK7 | CK8 | CK9 | PATH | CLOCK |
| 1 | 0 | 0 | 0 | 0 | 0 | 1 | 1 | 1 | 1 | k1 | CK0, CK6 |
| 1 | 1 | 0 | 0 | 0 | 0 | 0 | 1 | 1 | 1 | k6 | CK2, CK8 |
| 1 | 1 | 1 | 0 | 0 | 0 | 0 | 0 | 1 | 1 | k2 | CK4, CK0 |
| 1 | 1 | 1 | 1 | 0 | 0 | 0 | 0 | 0 | 1 | k7 | CK6, CK2 |
| 1 | 1 | 1 | 1 | 1 | 0 | 0 | 0 | 0 | 0 | k3 | CK8, CK4 |
| 0 | 1 | 1 | 1 | 1 | 1 | 0 | 0 | 0 | 0 | k8 | CK1, CK7 |
| 0 | 0 | 1 | 1 | 1 | 1 | 1 | 0 | 0 | 0 | k4 | CK3, CK9 |
| 0 | 0 | 0 | 1 | 1 | 1 | 1 | 1 | 0 | 0 | k9 | CK5, CK1 |
| 0 | 0 | 0 | 0 | 1 | 1 | 1 | 1 | 1 | 0 | k5 | CK7, CK3 |
| 0 | 0 | 0 | 0 | 0 | 1 | 1 | 1 | 1 | 1 | k10 | CK9, CK5 |

The detecting signal CTRL and inverted detecting signal $\overline{CTRL}$ input to a loop filter 38. The loop filter 38 is comprised of a p-channel transistor 40 whose source receives the operational voltage Vdd via the current source 51 and whose gate receives the inverted detecting signal $\overline{CTRL}$, a p-channel transistor 42 whose gate receives the detecting signal CTRL and whose source receives the operational voltage Vdd via the current source, an n-channel transistor 44 whose channel is connected between the drain of the p-channel transistor 40 and a grounding terminal thereof and whose gate is connected to the drain of the p-channel transistor 40, an n-channel transistor 46 whose channel is connected between the drain of the p-channel transistor 42 and a grounding terminal thereof and whose gate is connected in common to the gate of the n-channel transistor 44, and a capacitor 48 connected between the drain of the n-channel transistor 46 and the grounding terminal thereof. The p-channel transistors and n-channel transistors 40, 42, 44, and 46 form a differential amplifier and a current mirror structure as a loading element, and supply a charging current to the capacitor 48 in proportion to the logic difference of the signals CTRL and $\overline{CTRL}$ or discharge the voltage charged to the capacitor 48. The charging voltage of the capacitor 48 is supplied in common to each delay cell 20, as the phase control signal $V_{CTL1}$.

Figure 3:
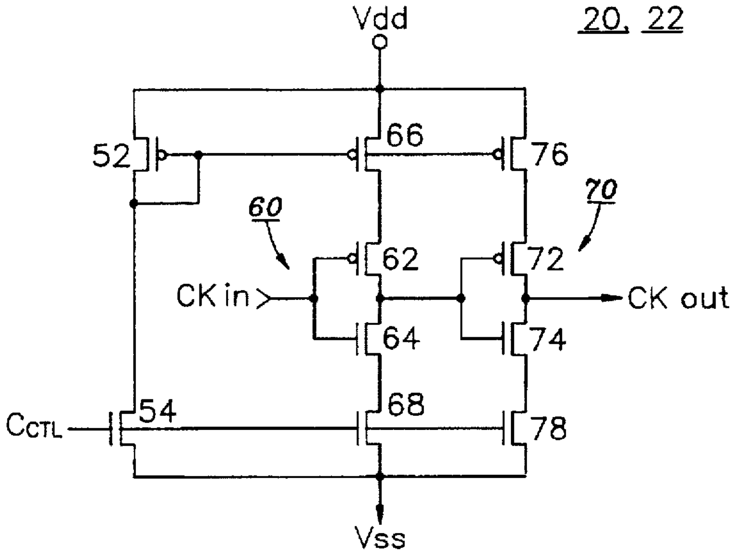
FIG. 3 is a circuit diagram showing a delay cell used in the first and second delay locked loops of FIG. 1.

FIG. 3 is a circuit diagram showing a delay cell used in the first and second delay locked loops of FIG. 1. In construction, a p-channel transistor 52 whose source is connected to an operational voltage Vdd and whose drain and gate are connected in common to each other, which drain is connected to a ground voltage Vss via the channel of an n-channel transistor 54 and as a result, serves as a current source. A clock CKin inputs to a CMOS inverter 60, and a CMOS inverter 70 which inverts the output of the CMOS inverter 60 outputs a clock CKout phase-delayed from the clock CKi. The CMOS inverters 60 and 70 are comprised of p-channel transistors 62 and 72 and n-channel transistors 64 and 74, in which one terminal of the p-channel transistor 62 is connected in series to that of the n-channel transistor 64, and one terminal of the p-channel transistor 72 is connected in series to that of the n-channel transistor 74. The other terminals of the p-channel transistors 62 and 72 are connected to the operational voltage Vdd via corresponding p-channel transistors 66 and 76, and the other terminals of the n-channel transistors 64 and 74 are connected to the grounding terminal in which a grounding voltage Vss is supplied, via corresponding n-channel transistors 68 and 78. The gates of the p-channel transistors 66 and 76 are connected to a common drain-source connection point of the p-channel transistor 52 serving as the current source. The gates of the n-channel transistors 54, 68, and 78 receive in common the phase control signal $V_{CTL}$.

Figure 4:
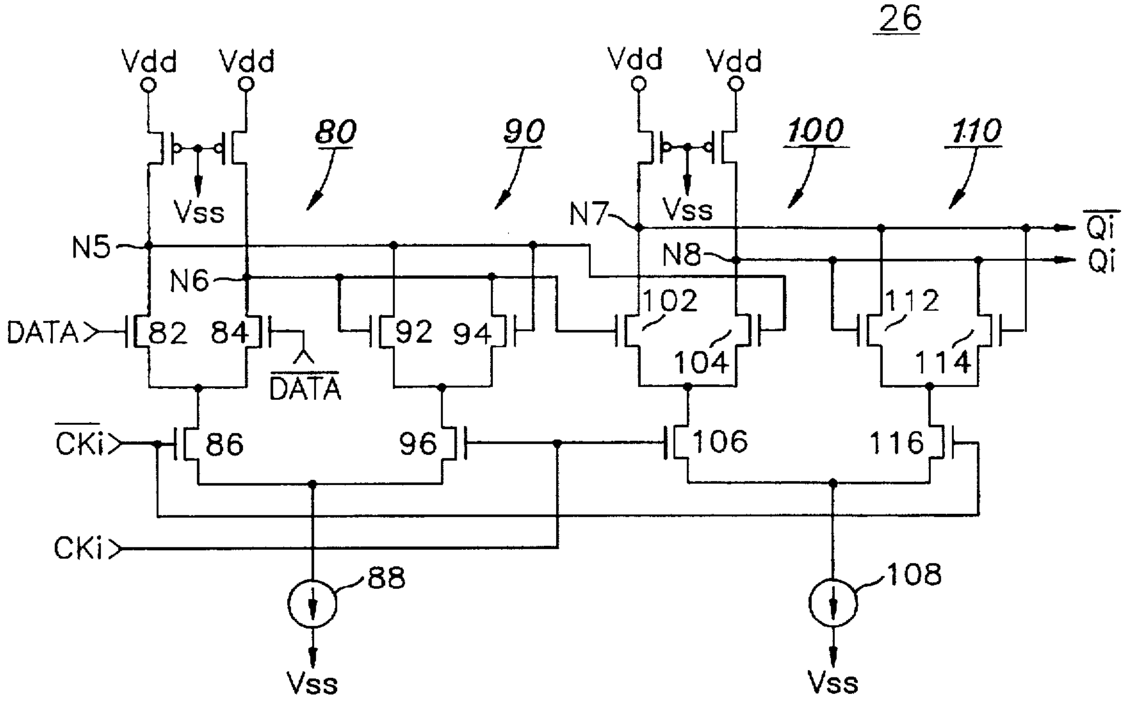
FIG. 4 is a circuit diagram showing a master-slave type of flip-flop of FIG. 1.

FIG. 4 is a circuit diagram showing a master-slave type of flip-flop DFFi 26 of FIG. 1. In construction, the master-slave type of flip-flop DFFi is comprised of four differential amplifiers 80, 90, 100, and 110.

The first differential amplifier 80 includes output nodes N5 and N6 which are connected to an operational voltage Vdd through the respective corresponding p-channel transistors, operating as the loading elements, whose gates are supplied with the grounding voltage, n-channel transistors 82 and 84 whose drains are respectively connected to the output nodes N5 and N6 and whose gates respectively receive the input data bit column and the inverted input data bit column $\overline{DATA}$, and an n-channel transistor 86 whose drain is connected in common to the sources of the n-channel transistors 82 and 84, whose source is connected to the grounding terminal via a current source 88, and whose gate receives an inverted clock $\overline{CKi}$. The second differential amplifier 90 includes an n-channel transistor 92 whose drain is connected to the output node N5 and whose gate is connected to the output node N6, an n-channel transistor 94 whose drain is connected to the output node N6 and whose gate is connected to the output node N5, and an n-channel transistor 96 whose drain is connected in common to the sources of the n-channel transistors 92 and 94, whose source is connected to the grounding terminal via the current source 88, and whose gate receives the clock CKi. The third differential amplifier 100 includes output nodes N7 and N8 which are connected to the operational voltage Vdd through the respective corresponding p-channel transistors, operating as the loading elements, whose gates are supplied with the grounding voltage, n-channel transistors 102 and 104 whose drains are respectively connected to the output nodes N7 and N8 and whose gates are respectively connected to the output nodes N6 and N5, and an n-channel transistor 106 whose drain is connected in common to the sources of the n-channel transistors 102 and 104, whose source is connected to the grounding terminal via a current source 108, and whose gate receives the clock CKi. The fourth differential amplifier 110 includes an n-channel transistor 112 whose drain is connected to the output node N7 and whose gate is connected to the output node N8, an n-channel transistor 114 whose-drain is connected to the output node N8 and whose gate is connected to the output node N7, and an n-channel transistor 116 whose drain is connected in common to the sources of the n-channel transistors 112 and 114, whose source is connected to the grounding terminal via the current source 108, and whose gate receives the $\overline{CKi}$. The output node N7 outputs a complementary output $\overline{Qi}$ and the output node N8 outputs an output Qi.

The construction of the flip-flop has the similar construction to FIG. 2 mentioned above showing clocks which are locked to the middle point of the corresponding data bit so as to have the rising edges. By such a similar construction, a smooth data reception can be achieved, even though the size of the logic level of the input data bit is different from that of the clocks, as the time when data sampling is executed by the clocks in the flip-flop is identical to the time when the clocks are consistent with the middle point of the corresponding data bit in the phase detector 28.

Figures 5A, 5B, 5C:
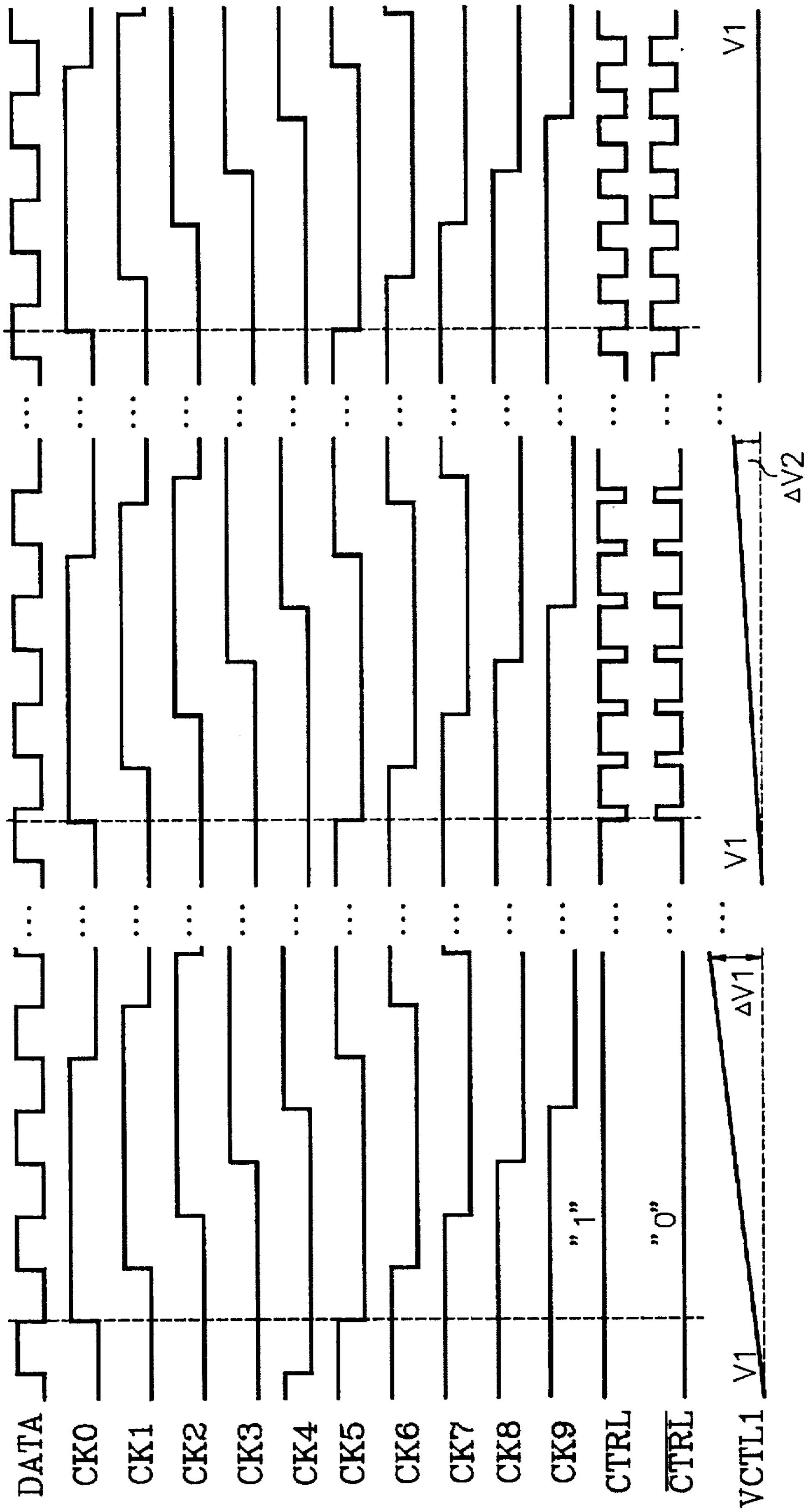
FIGS. 5A–5C are operational timing diagram showing phase consistency between an input data bit column and clocks CK0 through CK9 of FIG. 2.
Figure 6:
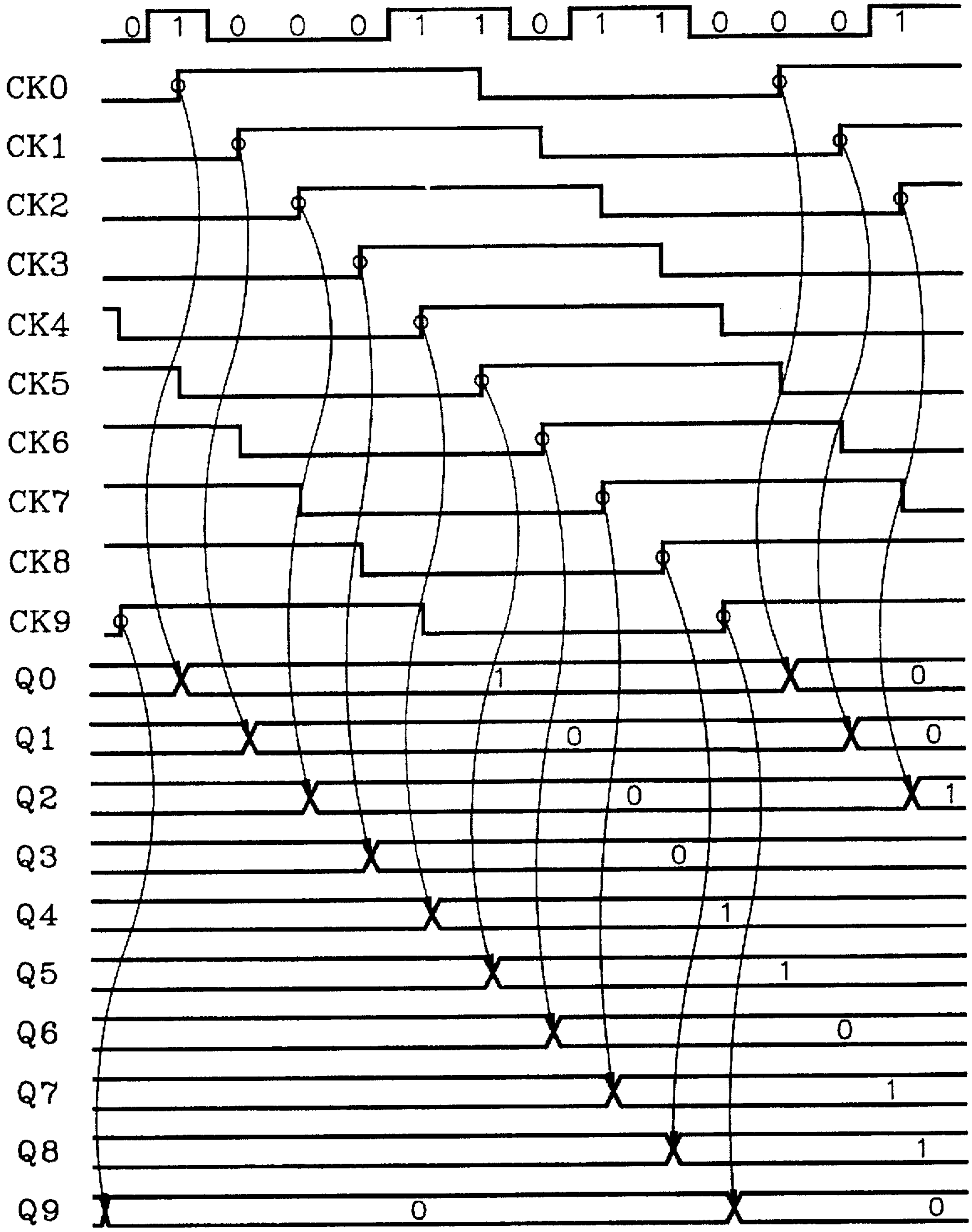
FIG. 6 is a timing diagram showing an operation of the data register of FIG. 1.

FIG. 5 is an operational timing diagram showing the phase consistency between an input data bit column and clocks CK0 through CK9 of FIG. 2, and FIG. 6 is a timing diagram showing an operation of the data register 14 of FIG. 1. Details of operation of FIG. 1 will be hereinafter discussed with reference to FIGS. 2 to 6.

The first DLL 10 receives the input clock through the delay cells 20 and then transmits the pulse having the frequency of the input clock to the secondary DLL 12. The delay cells 20 are elements, in which the delay time thereof is controlled by the phase control signal $V_{CTL1}$ outputted from the ten-phases detector 28. Referring to FIG. 3, the transmission delay time of the delay cells 20 and 22 represents the sum of the delay time necessary for the inversion operations of the CMOS inverters 60 and 70. The delay time through the CMOS inverters 60 and 70 is dependent upon a current driving capability of the corresponding p-channel transistors 66 and 76 on the current path supplied from the operational voltage Vdd, and the corresponding n-channel transistors 68 and 78 on the discharging path to the grounding voltage Vss. Hence, in accordance with the voltage size of the phase control signal $V_{CTL1}$ applied to the gates of the n-channel transistors 68 and 78, the channel size of the n-channel transistors 68 and 78 is controlled and as a result, the discharging path is controlled. Further, since the electric current flowing through the channel of the p-channel transistor 52 as the current source is controlled, as the phase control signal $V_{CTL1}$ is applied to the gate of the n-channel transistor 54, the size of the electric current supplied via the channels of respective p-channel transistors 66 and 76 is controlled. Accordingly, if the voltage level of the phase control signal $V_{CTL1}$ becomes high, the channels of the p-channel transistors 66 and 76 and the n-channel transistors 68 and 78 are controlled so as to have a large amount of electric current. As a result, the delay time for the inversion operations of the CMOS inverters 60 and 70 becomes short. On the contrary, if the voltage level of the phase control signal $V_{CTL1}$ becomes low, the channels of the p-channel transistors 66 and 76 and the n-channel transistors 68 and 78 are controlled so as to limit an amount of electric current flow thereof. As a result, the delay time for the inversion operations of the CMOS inverters 60 and 70 becomes long.

Referring to FIG. 2, the secondary DLL 12 serves to output the clocks CK1–CK10 via nine delay cells 22 and delay cell 22a from the input clock. At this time, respective clocks are sequentially delayed by 2π/10 radian (that is, 36°) and as mentioned above, the clocks CK0 and CK10 have the phase difference of 2π. The clocks CK0–CK9 are supplied to the first DLL 10 and data register 14, respectively. The clocks CK0–CK9 supplied to the data register 14 respectively input to the clock terminals of the corresponding flip-flops DFF0–DFF9 26, thereby executing the operation for controlling data input and output of each flip-flop 26.

In the meanwhile, the clocks CK0–CK9 supplied to the first DLL 10 input to the ten-phases detector 28. Referring to FIG. 2, the clocks CK0–CK9 inputted to the ten-phases detector 28 input to the gates of the n-channel transistor forming the discharging lines k1–k10, as shown in the afore-mentioned Table <1>. As shown in FIG. 3, depending upon the logic of clocks CK0–CK9, any one of the discharging lines k1–k5 connected to the first discharging node N3 and of the discharging lines k6–k10 connected to the second discharging node N4 forms a discharging path. In this case, the discharging path is formed so that the first discharging node N3 and the second discharging node N4 are alternatively connected to the grounding terminal by the combination of the clocks CK0–CK9. Consequently, any one of the first discharging node N3 and the second discharging node N4 forms the discharging path during the 1/10 of input clock period, i.e. the period of the input data bit column and the other thereof is in a floating state. Such an operation is repeated every period of the input data bit column. The logic levels of detecting signal and inverted detecting signal CTRL and $\overline{CTRL}$ respectively outputted from the first discharging node N3 and the second discharging node N4 are determined in dependence on the logic levels of the input data bit DATA and the inverted input data bit $\overline{DATA}$.

Now, the sequential process forming the phase difference of 90° between the clocks and each input data bit by the operation of the ten-phases detector 28 of FIG. 2 will be described with reference to FIGS. 5A to 5C.

First, as depicted in FIG. 5A, in the case that the clocks in the rising edge have a phase difference from the corresponding input data bit in the falling edge, the first output node N1 is connected to the second discharging node N4 floated as the discharging lines k6–k10 are all cut off, when any one of the discharging lines k0–k5 is selected and the first discharging node N3 is connected to the grounding terminal. On the other hand, the first output node N1 is connected to the first discharging node N3 floated as the discharging lines k1–k5 are all cut off, when any one of the discharging lines k6–k10 is selected and the second discharging node N4 is connected to the grounding terminal. Consequently, the detecting signal CTRL maintaining the logic level of "1" is outputted by the load R1. However, as the second output node N2 is connected on the contrary, unlike the above-mentioned first output node N1, the second output node N2 is always connected to the grounding terminal. Consequently, the inverted detecting signal $\overline{CTRL}$ maintaining the logic level of "0" is outputted. The p-channel transistor 40 of the loop filter 38 is turned off, and the p-channel transistor 42 is turned on, by the detecting signal CTRL of the logic level of "1" and the inverted detecting signal $\overline{CTRL}$ of the logic level of "0". As a result, since the charging current is supplied to the capacitor 48, the level of the phase control signal $V_{CTL1}$ is raised from the level of an initial level of V1 up to the level of V1+ΔV1, and the delay time of respective delay cells 20 in the first DLL 10 becomes short. Hence, the clocks CK1–CK10 outputted from the secondary DLL 12 are adjusted and then outputted so that respective rising edges of the clocks CK1–CK10 precede an initial generated phase thereof.

Referring to FIG. 5B, in the case that the clocks CK0–CK9 outputted from the first DLL 10 are outputted to have the preceding phase as much as a given amount, for instance, 0.25 radians (45°), since they are connected to the first discharging node N3 or the second discharging node N4 forming the discharging path only when there is a phase difference between the bit columns of the input data DATA and $\overline{DATA}$ and the clocks CK0–CK9, the first output node N1 has the logic level of "0" only during a short generating time of the phase difference and outputs the detecting signal CTRL maintaining the logic level of "1", during the time except the generating time of the phase difference. However, when connected on the contrary, unlike the above-mentioned first output node N1, the second output node N2 has the logic of "1" only during a short generating time of the phase difference and outputs the inverted detecting signal $\overline{CTRL}$ maintaining the logic level of "0", during the time except the generating time of the phase difference. Hence, the turn-on state of the p-channel transistor 40 of the loop filter 38 is extended by the detecting signal CTRL, and the turn-on state of the p-channel transistor 42 of the loop filter 38 is also extended by the inverted detecting signal $\overline{CTRL}$, so that the charging current supplied to the capacitor 48 can be reduced. As a result, the voltage level of the phase control signal $V_{CTL1}$ becomes the level of V1+ΔV2 lower than the level of V1+ΔV1 and the respective delay cells 20 of the first DLL 10 are controlled so as to have a shorter delay time. In this case, the clocks CK1–CK10 outputted from the secondary DLL 12 are outputted to have a more preceding phase than that of FIG. 5A and as shown in FIG. 5C, the phases of the clocks CK1–CK10 are locked to the middle point of the corresponding input data bit so as to have the rising edge. When the phases of the clocks CK1–CK10 are locked, since the first output node N1 is connected to the first discharging node N3 or the second discharging node N4 which forms a discharging path during 0.2π radian having the phase difference between the bit columns of the input data DATA and inverted input data $\overline{DATA}$ and the clocks CK1–CK10, the first output node N1 has the logic level of "0" during a generating time of the phase difference and outputs the detecting signal CTRL maintaining the logic level of "1" which has duty of 50%, during the time except the generating time of the phase difference. However, when connected on the contrary, unlike the above-mentioned first output node N1, the second output node N2 has the logic level of during a generating time of the phase difference and outputs the inverted detecting signal $\overline{CTRL}$ maintaining the logic level of "0" which has duty of 50%, during the time except the generating time of the phase difference. Hence, the turn-off time of the p-channel transistor 40 of the loop filter 38 by the detecting signal CTRL is identical to the turn-on time of the p-channel transistor 42 by the inverted detecting signal $\overline{CTRL}$, so that an amount of the charging current supplied to the capacitor 48 is equal to that of the discharging current to the grounding terminal through the p-channel transistor 46. The phase control signal $V_{CTL1}$ maintains an initial level of V1, and the phase of the clock outputted from the delay cells 20 of the first DLL 10 is locked. The phases of the clock CK0 obtaining the frequency from the input clock inputted to the first DLL 10 and of the clocks CK1–CK9 outputted from the secondary DLL 12 are locked to the middle point of the corresponding input data bit to have the rising edges. Such phase-locked clocks CK0–CK9 are supplied to the flip-flops 26 of the data register 14.

The process of data register operations of the flip-flops 26 will be discussed with reference to FIGS. 4 and 6.

When the clock CKi of the logic level of "0" is supplied and the inverted clock $\overline{CKi}$ of the logic level of "1" is supplied, the n-channel transistors 86 and 116 are turned on and the first and fourth differential amplifiers 80 and 110 are thereafter activated. Simultaneously, the n-channel transistors 96 and 106 are turned off and the second and third differential amplifiers 90 and 100 are thereafter not activated. In this case, when the input data bit DATA of the logic of "1" is received and the inverted input data bit $\overline{DATA}$ of the logic of "0" is received, the third output node N5 of the first differential amplifier 80 is changed to the logic level of "0", and the fourth output node N6 is changed to the logic level of "1". However, since the second and third differential amplifiers 90 and 100 are in non-activation states, the output Qi and the complementary output $\overline{Qi}$ maintain their previous states.

Next, the n-channel transistors 86 and 116 are turned off and thereby, the first and fourth differential amplifiers 80 and 110 are not activated as the clock CKi is raised to the logic level of "1" in the middle point of the input data bit. Simultaneously, the n-channel transistors 96 and 106 are turned on and thereby, the second and third differential amplifiers 90 and 100 are activated. As a result, the second differential amplifier 90 causes the third output node N5 to be latched to the logic level of "0" and the fourth output node N6 to be latched to the logic level of "1". In the third differential amplifier 100, the n-channel transistor 102 whose gate is connected to the fourth output node N6 is turned on and the n-channel transistor 104 whose gate is connected to the third output node N5 is turned off, so that the fifth output node N7 outputs the output Qi of the logic level of "1" and the sixth output node N8 outputs the complementary output $\overline{Qi}$ of the logic level of "0". While the clock CKi maintains a logic high level, since all operations of the first to fourth differential amplifiers 80, 90, 100 and 110 are fixed, the output of the flip-flop is not changed regardless of the change to the logic level "0" or "1" of the input data.

As the clock CKi is changed to a logic low level, the n-channel transistors 86 and 116 are turned on and thereby, the first and fourth differential amplifiers 80 and 110 are activated. Simultaneously, the n-channel transistors 96 and 106 are turned off and thereby, the second and third differential amplifiers 90 and 100 are not activated. In this case, as the input data bit DATA is logic-converted, even though logic levels of third and fourth output nodes N5 and N6 are changed, the final output Qi and the complementary output $\overline{Qi}$ maintain the previous states since the second and third differential amplifiers 90 and 110 are in the non-activation states.

The operation as discussed above is performed in all flip-flops 26 DFF0–DFF9 in the same manner. The flip-flops 26 DFF0–DFF9 receive in sequence the input data bit column by one bit via a data line DIL and then output the received data. In this case, since the phase of each clock is locked to the middle point of the corresponding input data bit so as to have the rising edge, each flip-flop receives data of the logic level of "0" or the logic of "1" which the data bit has in the middle point of the input data bit. Consequently, the logic level of data is accurately received.

Figure 7:
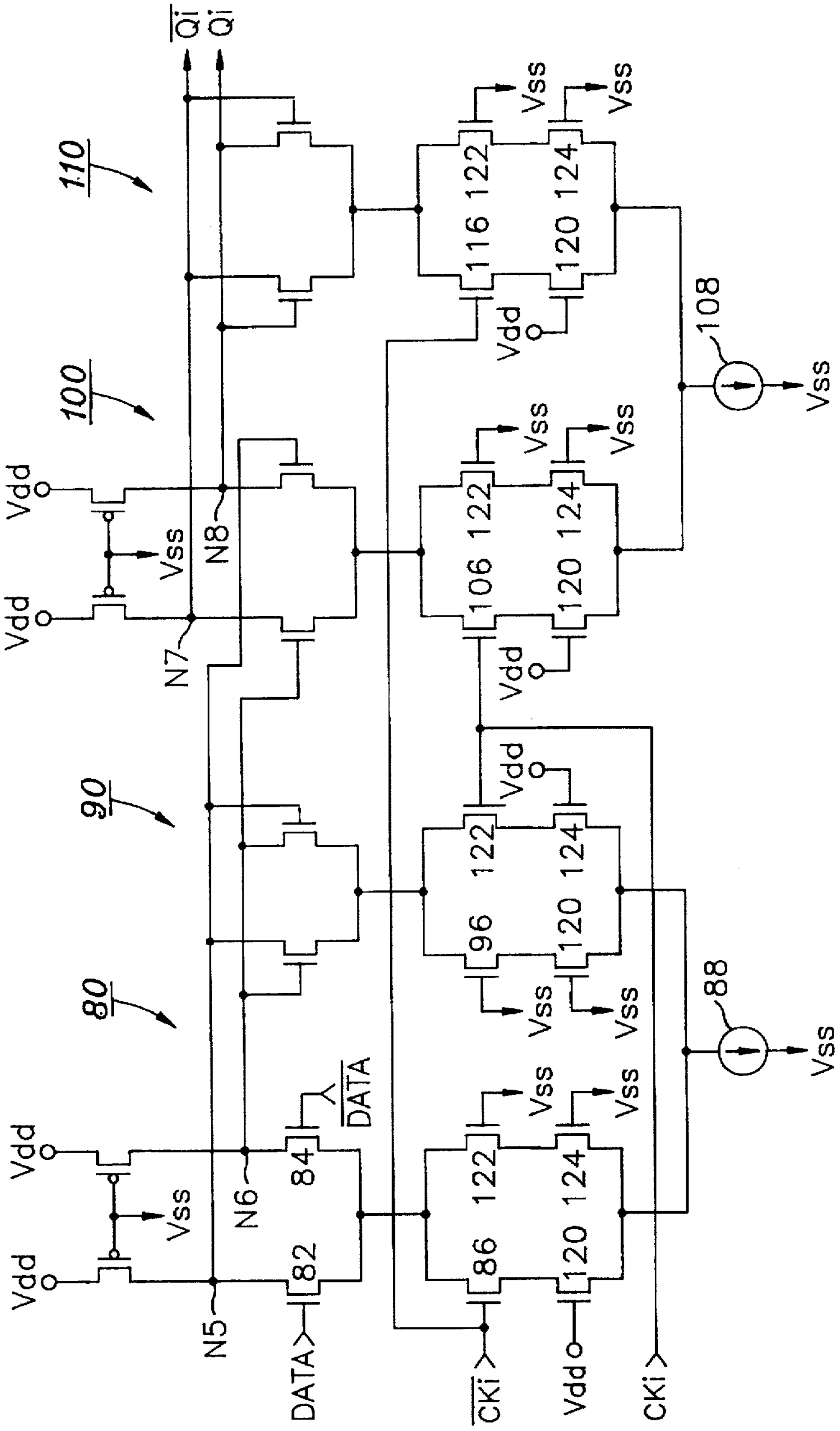
FIG. 7 is a circuit diagram showing another embodiment of the master-slave type of flip-flop of FIG. 1.

FIG. 7 is a circuit diagram showing another embodiment of the master-slave type of flip-flop of FIG. 1, in which the transistors 86, 96, 106, and 116 controlling the activation/non-activation operations of respective differential amplifiers have dummy transistors unlike those of FIG. 4. In other words, the n-channel transistor 86 controlling the operation of the first differential amplifier 80 is connected to the current source 88 via a dummy transistor 120 in which a power supply voltage Vdd is applied to the gate thereof. Further, dummy transistors 122 and 124, in which channels are connected in parallel to each other and the grounding voltage Vss is applied to the gates thereof, respectively, are in parallel with the n-channel transistor 86 and dummy transistor 120 connected in series to each other. Since the operational voltage Vdd is applied to the gate of the dummy transistor 120, the dummy transistor 120 always keeps a turn on state and since the grounding voltage Vss is applied to the gates of the dummy transistors 122 and 124, the dummy transistors 122 and 124 always keep a turn off state. Hence, it is understood that a transistor for controlling the activation/non-activation operations of the first differential amplifier 80 is the above-mentioned n-channel transistor 86 whose gate receives the inverted clock $\overline{CKi}$. The reason why the transistors 86, 96, 106 and 116 have the dummy transistors 120, 122, and 124 is to perform a good data sampling even when the data bit has the logic level of lower voltage than that of the clocks by identifying the loads of the output nodes N3 and N4 of FIG. 2 for locking the phases of the clocks CK0–CK9 by the logic levels of the input data bit DATA and $\overline{DATA}$ with the loads of the output nodes N5, N6, N7, and N8 in which respective outputs thereof are determined by the input data bit DATA and $\overline{DATA}$. It is concluded that it is advantageous to adapt the flip-flop shown in FIG. 7 rather than to adapt the flip-flop shown in FIG. 4, in sampling of input data having a low logic level. Further, FIG. 7 executes the same operation as FIG. 4.

As discussed above, a data receiving method according to the present invention is capable of eliminating timing skew occurring between input data and an input clock, by generating 10 clocks which have the same frequency as the input clock and are in sequence delayed so as to have phase difference of 0.2π, and by phase-controlling the rising edges of the 10 clocks to be locked to the middle point of the corresponding data bit, thereby receiving the input data at high speed.

In the embodiment of FIG. 1, the ten-phases detector 28 uses ten clocks, but it is possible that the number of clocks is set as 2n (n=a natural number) having the phase difference of 2π/2n from each other. At this time, the phase detector as shown in FIG. 2 is designed to have n discharging paths which alternatively connect the first and second discharging node to the grounding terminal by the clocks. In this case, a great number of clocks rather than a small number of clocks are advantageous to register input data at high speed by using a lower frequency, but it is preferable that the capacitive load to the discharging node of FIG. 2 should be enough considered.

As stated above, the present invention is advantageous in such ways as eliminating timing skew between input data inputted to a data register and an input clock and achieving an accurate data reception, and further provides a data receiving circuit for digital communication systems capable of improving the quality of data reception.

What is claimed is:

1. A data receiving circuit of a digital communication system which receives a transmitted input data bit column and input clock, said data receiving circuit comprising:

a first clock generator having a first delay cell that receives a frequency from said input clock and outputs a first clock having said frequency;

a delay locked loop having 2n–1 secondary delay cells and a final node delay cell connected in series to each other which allow said first clock to be sequentially phase-delayed by 2π/2n, said 2n–1 secondary delay cells outputting 2n–1 clocks, each of said 2n–1 clocks having a respective phase delay from said first clock, said delay locked loop locking a phase difference of 2π radians between said first clock and an output clock of said final node delay cell;

a phase detector that outputs a phase control signal which controls a delay time of said first delay cell so that 2n clocks, comprised of said first clock generated by said first clock generator and said 2n–1 clocks outputted from said 2n–1 secondary delay cells of said delay locked loop, can have rising edges in the middle point of a corresponding input data bit by detecting a phase difference between phases of said input data bit column and said 2n clocks and controlling said first delay cell in accordance with the detected phase difference; and a data register controlled by said 2n clocks so as to receive said input data bit column.

2. The data receiving circuit as claimed in claim 1, wherein said first delay cell is comprised of a plurality of delay cells connected in series to each other which receive said input clock from an input node and produce said first clock from an output node.

3. The data receiving circuit as claimed in claim 2, wherein said delay locked loop further includes:

a phase detector and loop filter that detects a phase difference between said first clock and said 2n–1 clocks respectively outputted tom said 2n–1 secondary delay cells, controls a phase delay of said secondary delay cells as a result of the detection, and locks a phase delay of 2π radians between said first clock and said output clock of said final node delay cell.

4. The data receiving circuit as claimed in claim 2, wherein:

each of said 2n–1 secondary delay cells is connected so as to receive an output clock of a previous node at an input node thereof, and to produce a respective one of said 2n–1 clocks phase-delayed by 2π/2n from said output clock received from said previous node at an output node thereof.

5. The data receiving circuit as claimed in claim 4, wherein said phase detector is further comprised of:

a first output node connected to a first current source for outputting a first phase control signal, and selectively connected to a first discharging node or a second discharging node in accordance with the logic level of said input data bit column;

a second output node connected to a second current source for outputting a second phase control signal, and selectively connected to said first discharging node or said second discharging node unlike said first output node;

a discharging controller for forming a discharging path so that said first discharging node and said second discharging node can be connected to a grounding terminal in correspondence with the logic level of said 2n clocks; and a loop filter, said loop filter including a differential amplifier having a comparison input between said first phase control signal and said second phase control signal, a current mirror as a load element, and a capacitor connected to an output node of said current mirror to control a phase operation by supplying a charging voltage from said current mirror to the delay cell of said first clock generator.

6. The data receiving circuit as claimed in claim 5, wherein said data register further includes 2n flip-flops, each of said flip-flops having:

an input terminal connected in common to a data input line applying said input data bit column, a clock input for receiving a corresponding clock among said 2n clocks, and an output node for outputting one respective bit of said input data bit column.

7. The data receiving circuit as claimed in claim 6, wherein said input data bit column has a maximum transmission speed 2n times as high as said input clock.

8. A data receiving method of a digital communication system for recovering received data by receiving a data bit column and a synchronizing clock, said method comprising the steps of:

receiving said synchronizing clock having a frequency and producing a first clock having said frequency to be phase-delayed during a predetermined time;

producing 2n−1 clocks respectively having a phase difference of $2\pi/2n$ from said first clock;

controlling a delay time of said first clock so that 2n clocks, comprised of said first clock and said 2n−1 clocks, have a rising edge in the middle point of a corresponding data bit by detecting a phase difference between phases of an input data bit column and said 2n clocks; and recovering data by sampling data of said input data bit column, synchronous to said 2n clocks.

* * * * *